United States Patent [19]

Borisov et al.

[11] 4,380,006

[45] Apr. 12, 1983

[54] LINEAR INTERPOLATOR

[76] Inventors: Vladimir S. Borisov, ulitsa Lugovaya, 35/37, kv. 9; Vyacheslav V. Korovin, ulitsa Shekhurdina, 60, kv. 30, both of Saratov, U.S.S.R.

[21] Appl. No.: 271,649

[22] Filed: Jun. 8, 1981

[51] Int. Cl.³ .............................. H03K 13/02

[52] U.S. Cl. .............................. 340/347 CC; 364/571; 364/582

[58] Field of Search .................. 340/347 DA, 347 CC; 364/571, 582; 318/603, 604, 615; 328/14; 331/177 R

[56] References Cited

U.S. PATENT DOCUMENTS 4,125,896 11/1978 Metcalf .............................. 364/582

4,296,407 10/1981 Minakuchi .................. 340/347 CC

*Primary Examiner*—C. D. Miller

*Attorney, Agent, or Firm*—Murray Schaffer

[57] ABSTRACT

A linear interpolator comprising a code digital normalization unit, connected via digital-to-analog converters to comparators which couple an adjustable reference voltage source, and also connected via an OR gate to an integrator that connects said digital-to-analog converters having their outputs coupled respectively to X- and Y-axis voltage-to-frequency converters, the latter being connected to control circuits of actuation means.

1 Claim, 1 Drawing Figure

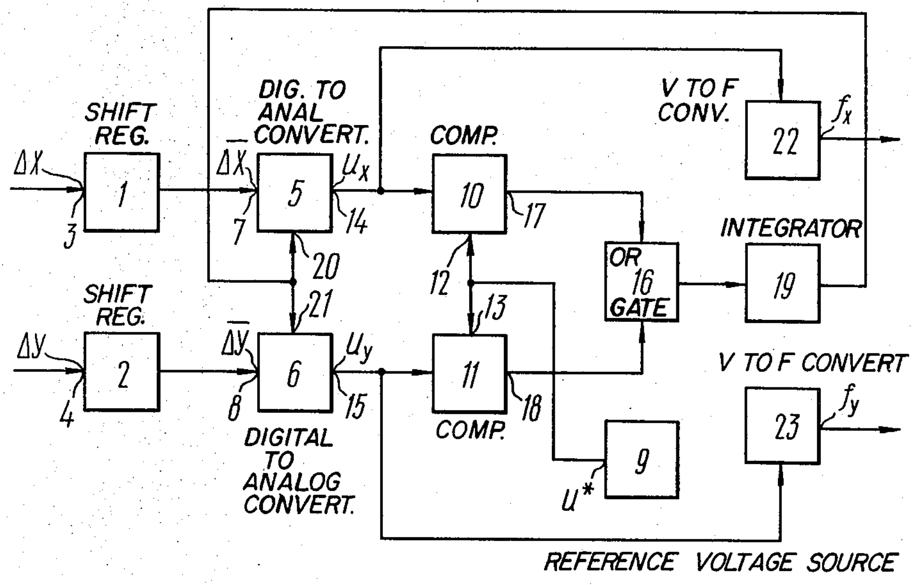
SHIFT REG.
1
2
3
4
ΔX
ΔY
DIG. TO ANAL CONVERT.
DIGITAL TO ANALOG CONVERT.
5
6
7
8
U_X
U_Y
14
15
20
21
COMP.
10
11
12
13
17
18
OR 16 GATE
INTEGRATOR
19
V TO F CONV.
22
f_x
V TO F CONVERT
23
f_y
9
U*
REFERENCE VOLTAGE SOURCE

LINEAR INTERPOLATOR

FIELD OF THE INVENTION

The invention relates to numerically controlled systems, and more particularly to linear interpolators.

The disclosed interpolator is applicable to program controlled systems of actuation means in which digital data on coordinate increments is converted to a train of control pulses.

DESCRIPTION OF THE PRIOR ART

Known in the art is a linear interpolator comprising a serial arrangement of a control unit, a pulse generator, and a frequency divider whose output is connected to a first input of a first counter and to a first input of a second counter (cf. the USSR Inventor's Certificate No. 551,611, 1977). In the known interpolator, a second input of the first counter is connected to the output of a first comparison unit and to a first input of a control unit, while the output of the first counter is connected to a first input of the first comparison unit which has its second input connected to a second input of the frequency divider and to the output of a first increment register.

The input of the first increment register is connected to one of the outputs of the control unit and another output thereof is connected to a third input of the frequency divider and to a first input of a second comparison unit.

A second input of the second comparison unit is connected to the output of a second counter, while the output of said unit is connected to second inputs of the second counter and the control unit. A first input of a third counter is connected to a second input of the first counter. A first input of a third comparison unit is connected to the output of the third counter which has its second input connected to a second increment register, and also has its output connected to a third input of the comparison unit and to the second input of the third counter. A first input of a fourth counter is connected to the second input of the second counter. A first input of a fourth comparison unit is connected to the output of a fourth counter. A second input of the fourth comparison unit is coupled to the output of the first increment register, while the output of said unit is coupled to a fourth input of the control unit and to the second input of the fourth counter.

The known interpolator fails to convert in unique fashion the codes representing greater increments to the repetition rate of the output pulses. Another disadvantage is that there is not therein a means with which one can control the repetition rate of the output pulses in the greater increments channel in a manner such that the pulse repetition rate ratio is held equal to the ratio between the codes representing the corresponding increments.

There is a prototype of the disclosed invention included in an interpolator as described in the USSR Inventor's Certificate No. 432,543, 1973 and comprising a code digital normalization unit having its inputs connected to the output of an external data source, and having its outputs connected to digit inputs of digital-to-analog converters which handle increment codes, and an additional digital-to-analog converter which has its digit inputs connected to the outputs of the code digital normalization unit, and also has its output connected to reference-voltage inputs of the digital-to-analog converters. The analog voltages produced by the latter are proportional to the ratios between the codes representing these voltages.

In the interpolator above the digital-to-analog converter dealing with greater increments fails to produce an output analog voltage which could be uniquely related to different codes representing greater increments.

SUMMARY OF THE INVENTION

It is accordingly an object of the present invention to provide a linear interpolator having a pulse repetition rate, at a given reference voltage, independent of codes representing greater coordinate increments.

It is another object to provide such a linear interpolator wherein the repetition rate of the pulses corresponding to greater coordinate increments can be varied in wide limits and in accordance with a prescribed law to a higher degree of accuracy when changing the value of the reference voltage, with the result that the ratio between such rates is held equal to the ratio between the codes representing the coordinate increments.

The objects of the present invention are attained in a linear interpolator comprising a code digital normalization unit which includes two shift registers and has its inputs connected to an external data source, two digital-to-analog converters adapted to convert digital data to analog voltage and having their digit inputs connected to the outputs of the code digital normalization unit, said interpolator comprises, in accordance with the invention, an adjustable reference voltage source, two comparators adapted to compare the output voltages produced by the digital-to-analog converters with a reference voltage, having their first inputs joined together and connected to the output of the adjustable reference voltage source, and having their second inputs connected respectively to the outputs of the digital-to-analog converters, an OR gate having its inputs connected to the outputs of the comparators, an integrator having its input connected to the output of the OR gate and having its output connected to joined reference-voltage inputs of the digital-to-analog converters, an X-axis voltage-to-frequency converter adapted to convert analog voltage to trains of control output pulses, having its input connected to the output of the first digital-to-analog converter, and having its output connected to the control circuit of a first actuation means, and an Y-axis voltage-to-frequency converter having its input connected to the output of the second digital-to-analog converter and having its output connected to the control circuit of a second actuation means.

The disclosed linear interpolator makes it possible to convert data on coordinate increments to trains of pulses having such repetition rates that the ratios between the latter are equal to the ratios between the codes representing the coordinate increments; to obtain a maximum pulse repetition rate corresponding to greater coordinate increment and independent of the greater increment code; and to vary said maximum pulse repetition rate in wide limits and in accordance with a prescribed law to a higher degree of accuracy.

The present invention is therefore advantageous in that efficiency of actuation means is increased at comparatively low hardware costs and these means can be operated at the required points in time when the repetition rate of the pulses passing through the greater coordinate increment channel is varied in accordance with a prescribed law, the accuracy of interpolation being high.

BRIEF DESCRIPTION OF THE DRAWINGS

The invention will now be described in more detail, by way of example, with reference to the accompanying drawing in which a block diagram of a linear interpolator is shown in accordance with the invention.

DETAILED DESCRIPTION OF THE INVENTION

Referring to the FIGURE, a linear interpolator comprises, accordance with the invention, a code digital normalization unit which includes the following: shift registers 1,2 of conventional design (cf. a book entitled "The Design of Radioelectronic Devices Using Integrated Circuits." Edited by S. Ya. Shats. Moscow, Sovetskoye Radio Publishers, 1976, pp. 243-265, in Russian), said shift registers having their inputs 3,4 connected to an external data source (not shown in the drawing); and digital-to-analog converters 5,6 of conventional design adapted to convert digital data to analog voltage (cf. a book entitled "Integrated Circuits for Analog-to-Digital and Digital-to-Analog Converters". Edited by L. M. Lukyanov. Moscow, Energiya Publishers, 1978, in Russian), said converters having their digit inputs 7, 8 connected to the outputs of the shift registers 1,2, respectively.

The linear interpolator of the present invention comprises an adjustable reference voltage source 9 (cf. a book by A. G. Alekseenko entitled "Microcircuit Engineering". Moscow, Sovetskoye Radio Publishers, 1977, in Russian) and comparators 10, 11 (cf. ibid.) adapted to compare output voltages obtained from the digital-to-analog converters 5,6 to a reference voltage. Inputs 12, 13 of the comparators 10, 11 are joined together and connected to the output of the adjustable reference voltage source 9. The outputs of the comparators 10, 11 are connected to inputs 14, 15 of the digital-to-analog converters 5, 6.

There is an OR gate (cf. a book by I. N. Bukreev et al. entitled "Microcircuits for Digital Devices". Moscow, Sovetskoye Radio Publishers, 1973, in Russian) having its inputs connected to outputs 17, 18 of the comparators 10, 11, and having its output connected to the input of an integrator 19 (cf. a book by A. G. Alekseenko entitled "Microcircuit Engineering". Moscow, Sovetskoye Radio Publishers, 1977, in Russian). The output of the integrator 19 is connected to joined reference-voltage inputs 20, 21 of the digital-to-analog converters 5, 6.

The linear interpolator of the present invention comprises an X-axis voltage-to-frequency converter 22 (cf. a book Modern Applications of Linear Integrated Circuits. ed. by M. V. Galperin, Moscow, Energy Publishers, 1980, in Russian) adapted to convert analog voltage to trains of output control pulses. The converter 22 has its input connected to the output 14 of the digital-to-analog converter 5, and has its output connected to the control circuit of a first actuation means (not shown in the drawing). There is also an Y-axis voltage-to-frequency converter 23 (cf. ibid.) having its input connected to the output 15 of the digital-to-analog converter 6 and having its output connected to the control circuit of a second actuation means.

The linear interpolator of the present invention operates in the following manner. An external data source produces signals representing codes of increments $\Delta X$ and $\Delta Y$ each having an 1-bit length. These signals are applied to the inputs 3, 4, of the shift registers 1, 2.

The shift registers 1, 2 receive data and then shift it to the left k times, with the result that multiplication by $2^k$ is carried out, where $k=1-m$ with $m>n$ and $k=1-n$ with $n>m$, and m and n are the numbers of bits used for reading-in of the current codes of the increments $\Delta X$ and $\Delta Y$, respectively.

After shifts, the increment codes are given by $$\Delta\bar{X}=X2^k \text{ and } \Delta\bar{Y}=Y\cdot 2^k$$

Note that the ratio $\Delta\bar{x}/\Delta\bar{Y}$ is held equal to the ratio $\Delta X/\Delta Y$ and the range of variation of the greater increment codes reduces to $2^{1-1}$ to $(2^1-1)$ from 1 to $(2^1-1)$.

The digital-to-analog converters 5, 6 operate to convert $\Delta X$ and $\Delta Y$ codes to output analog voltages $U_X$ and $U_Y$ which are proportional to their corresponding codes and, consequently, to $\Delta\bar{X}$ and $\Delta\bar{Y}$ codes.

The produced voltages are applied to respective ones of the inputs of the comparators 10, 11 and to the inputs of the corresponding voltage-to-frequency converters 22, 23 The joined inputs 12, 13 of the comparators 10, 11 receive voltage $U^*$ obtained from the adjustable reference voltage source 9.

The comparators 10, 11 operate to compare voltages $U_X$ and $U_Y$ with reference voltage $U^*$. The signals obtained from the outputs 17, 18 of the comparators 10, 11 are applied to the OR gate 16 whose output signal is used to control the operation of the integrator 19.

The linear interpolator of the present invention operates in the following manner. An external data souce produces signals representing X and Y codes, said signals being applied to the shift registers 1, 2 where multiplication by $2^k$ is performed. The signals so obtained are applied to the digit inputs 7, 8 of the digital-to-analog converters 5, 6 which have in the initial state a zero reference voltage at their inputs 20, 21.

With the digital-to-analog converters 5, 6 energized, the integrator 19 is activated and its output voltage tends to rise. The latter voltage is applied to the inputs 20, 21 of the digital-to-analog converters 5, 6 and the voltages across their outputs 14, 15 tend to rise until the output voltage corresponding to greater increment code reaches the value of the given reference voltage $U^*$. Thereafter, the corresponding comparator, 10 or 11, operates, with the result that the OR gate 16 is activated and its output signals prevents the integrator 19 from being operated.

The condition in which the output voltage from the digital-to-analog converter corresponding to greater increment code drops by the hysteresis provided by the respective comparator results in the reset of the latter and the OR gate 16 operates to unblock the integrator 19.

Thus the voltage across the output of the digital-to-analog converter corresponding to greater increment code is always maintained equal to the given reference voltage with an accuracy determined by the hysteresis of the comparator.

Since the output of the integrator 19 is connected to the inputs 20, 21 of the digital-to-analog converters 5, 6, analog voltage across these inputs is a reference one given by $$U_X = U^* \text{ and } U_Y = U^* \frac{\Delta Y}{\Delta X} \text{ with } \Delta X > \Delta Y$$

-continued $$U_Y = U^* \text{ and } U_X = U^* \frac{X}{Y} \text{ with } \Delta Y > \Delta X$$

That is, the output voltage corresponding to greater coordinate increment code is maintained equal to reference voltage U*.

Note that the output voltage corresponding to lesser increment is proportional to the ratio between the corresponding codes.

The voltages obtained from the outputs 14, 15 of the digital-to-analog converters 5, 6 and applied to the inputs of the voltage-to-frequency converters 22, 23 are converted to trains of pulses having repetition rates $f_X$ and $f_Y$ which are proportional to respective voltages $U_X$ and $U_Y$; the repetition rate of the pulses passing through the greater coordinate increment channel is proportional to reference voltage U* and does not depend on the code representing greater coordinate increment. The repetition rate of the pulses in the lesser coordinate increment channel is proportional to the ratio between the corresponding codes. Varying reference voltage U* allows one to select such values of $f_X$ and $f_Y$ that $$\frac{f_X}{f_Y} = \frac{\Delta X}{\Delta Y}.$$

The fact that a feedback is established between the output 14 (or 15) of the digital-to-analog converter 5 (or 6) handling greater coordinate increment and the reference-voltage inputs 20, 21 of these converters makes it possible to select a reference voltage at which the output voltage of the corresponding digital-to-analog converter becomes equal to the reference voltage produced by the adjustable reference voltage source 9. As a result, at a given value of reference voltage, one can obtain a pulse repetition rate independent of codes representing greater coordinate increments and change said rate in wide limits by varying the reference voltage in accordance with a prescribed law.

With the disclosed linear interpolator, the efficiency of actuation means is increased due to the fact that the repetition rate of the control pulses passing through the greater increment channel does not depend on the codes and provides for the required time sequence of operation of actuation means since the repetition rate for the greater increment channel can be varied in accordance with a prescribed law at points in time desirable.

What is claimed is:

1. A linear interpolator to provide for conversion of codes representing X- and Y-axis increments obtainable from an external data source to corresponding trains of pulses applied to control circuits of first and second actuation means comprising:

a code digital normalization unit; shift registers of said unit; an input and an output of each of said shift register; said inputs of said shift registers connected to said external data source;

first and second digital-to-analog converters to convert digital data to analog voltage each having a first input, a second input, and an output, said second inputs being joined together;

respective ones of said inputs of said digital-to-analog converters connected to said outputs of said shift registers of said code digital normalization unit;

an adjustable reference voltage source having an output;

first and second comparators to compare output voltages from said digital-to-analog converters to a reference voltage each having a first input, a second input, and an output;

said first inputs of said comparators joined together and connected to said output of said adjustable reference voltage source;

said second inputs of said comparators connected respectively to said outputs of said digital-to-analog converters;

an OR gate having a first input, a second input and an output, said first and second inputs being connected to said second joined inputs of said digital-to-analog converters producing reference voltages;

an X-axis voltage-to-frequency converter to convert analog voltage to trains of output control pulses having an input and an output which are connected respectively to the output of said first digital-to-analog converter and the control circuit of said first actuation means;

an Y-axis voltage-to-frequency converter having an input and an output which are connected respectively to the output of said second digital-to-analog converter and the control circuit of said second actuation means.

* * * * *